United States Patent
Rahimo et al.

(10) Patent No.: US 9,006,041 B2
(45) Date of Patent: Apr. 14, 2015

(54) BIPOLAR PUNCH-THROUGH SEMICONDUCTOR DEVICE AND METHOD FOR MANUFACTURING SUCH A SEMICONDUCTOR DEVICE

(71) Applicant: ABB Technology AG, Zürich (CH)

(72) Inventors: Munaf Rahimo, Uezwil (CH); Arnost Kopta, Zürich (CH); Thomas Clausen, Seengen (CH); Maxi Andenna, Dättwil (CH)

(73) Assignee: ABB Technology AG, Zurich (CH)

(*) Notice: Subject to any disclaimer, the term of this patent is extended or adjusted under 35 U.S.C. 154(b) by 0 days.

(21) Appl. No.: 14/046,156

(22) Filed: Oct. 4, 2013

(65) Prior Publication Data
US 2014/0034997 A1    Feb. 6, 2014

Related U.S. Application Data

(63) Continuation of application No. PCT/EP2012/056456, filed on Apr. 10, 2012.

(30) Foreign Application Priority Data

Apr. 6, 2011   (EP) .................................. 11161304

(51) Int. Cl.
H01L 21/332    (2006.01)
H01L 21/8224   (2006.01)
(Continued)

(52) U.S. Cl.
CPC ...... *H01L 29/66325* (2013.01); *H01L 29/0834* (2013.01); *H01L 29/36* (2013.01);
(Continued)

(58) Field of Classification Search
CPC ............ H01L 29/7395; H01L 29/7397; H01L 29/66333; H01L 29/1095; H01L 29/1004; H01L 27/0623; H01L 27/0635; H01L 29/66234
USPC .......... 438/133, 135–138, 336, 527; 257/263, 257/273, 328, 329, 334, 497, 565, 591, 592
See application file for complete search history.

(56) References Cited

U.S. PATENT DOCUMENTS 5,811,873 A      9/1998  Soejima
7,518,197 B2 *   4/2009  Yamaguchi ................... 257/401
(Continued)

FOREIGN PATENT DOCUMENTS

EP       0749166 A1    12/1996
EP       0969501 A1     1/2000
(Continued)

OTHER PUBLICATIONS

Notification Transmittal of Translation of the International Preliminary Report on Patentability (Forms PCT/IB/326 and PCT/IB/373) and the Written Opinion of the International Searching Authority (Form PCT/ISA/237) issued on Oct. 17, 2013, by the International Bureau of WIPO in corresponding International Application No. PCT/EP2012/056456.(6 pages).

(Continued)

*Primary Examiner* — Hsien Ming Lee
(74) *Attorney, Agent, or Firm* — Buchanan Ingersoll & Rooney PC

(57) ABSTRACT

A method for manufacturing a bipolar punch-through semiconductor device is disclosed, which includes providing a wafer having a first and a second side, wherein on the first side a high-doped layer of the first conductivity type having constant high doping concentration is arranged; epitaxially growing a low-doped layer of the first conductivity type on the first side; performing a diffusion step by which a diffused inter-space region is created at the inter-space of the layers; creating at least one layer of the second conductivity type on the first side; and reducing the wafer thickness within the high-doped layer on the second side so that a buffer layer is created, which can include the inter-space region and the remaining part of the high-doped layer, wherein the doping profile of the buffer layer decreases steadily from the doping concentration of the high-doped region to the doping concentration of the drift layer.

17 Claims, 5 Drawing Sheets

(51) Int. Cl.
| | |
|---|---|
| *H01L 29/76* | (2006.01) |
| *H01L 29/00* | (2006.01) |
| *H01L 27/082* | (2006.01) |
| *H01L 29/66* | (2006.01) |
| *H01L 29/08* | (2006.01) |
| *H01L 29/36* | (2006.01) |
| *H01L 29/739* | (2006.01) |
| *H01L 29/861* | (2006.01) |

(52) U.S. Cl.
CPC .... *H01L29/66136* (2013.01); *H01L 29/66333* (2013.01); *H01L 29/66348* (2013.01); *H01L 29/7395* (2013.01); *H01L 29/7397* (2013.01); *H01L 29/861* (2013.01); *H01L 29/6609* (2013.01); *H01L 29/7393* (2013.01)

(56) References Cited

U.S. PATENT DOCUMENTS

| | | |
|---|---|---|
| 2002/0195658 A1 | 12/2002 | Linder |
| 2005/0151221 A1 | 7/2005 | Ohtani |
| 2007/0281442 A1 | 12/2007 | Rahimo et al. |

FOREIGN PATENT DOCUMENTS

| | | |
|---|---|---|
| EP | 1017093 A1 | 7/2000 |
| EP | 1672698 A1 | 6/2006 |
| JP | 60-145660 A | 8/1985 |
| JP | 1-235331 A | 9/1989 |

OTHER PUBLICATIONS

International Search Report (PCT/ISA/210) mailed on Jul. 10, 2012, by the European Patent Office as the International Searching Authority for International Application No. PCT/EP2012/056456.

Written Opinion (PCT/ISA/237) mailed on Jul. 10, 2012, by the European Patent Office as the International Searching Authority for International Application No. PCT/EP2012/056456.

European Search Report dated Aug. 29, 2011 for European Application No. 11161304.8.

Mitsuru Kekura et al., 8000-V 1000-A Gate Turn-Off Thyristor with Low On-State Voltage and Low Switching Loss, IEEE Transactions on Power Electronics, vol. 5, No. 4, Oct. 1990, pp. 430-435.

J. Vobecky, et al., Exploring the Silicon Design Limits of Thin Wafer IGBT Technology: The Controlled Punch Through (CPT) IBGT, Proceedings of the 20th International Symposium on Power Semiconductor Devices & IC's, May 18-22, 2008, Orlando, FL, pp. 76-79.

* cited by examiner

BIPOLAR PUNCH-THROUGH SEMICONDUCTOR DEVICE AND METHOD FOR MANUFACTURING SUCH A SEMICONDUCTOR DEVICE

RELATED APPLICATION(S)

This application claims priority as a continuation application under 35 U.S.C. §120 to PCT/EP2012/056456, which was filed as an International Application on Apr. 10, 2012, designating the U.S., and which claims priority to European Application No. 11161304.8 filed in Europe on Apr. 6, 2011. The entire contents of these applications are hereby incorporated herein by reference in their entireties.

FIELD

The disclosure relates to the field of power electronics and for example to a method for manufacturing a bipolar punch-through semiconductor device and to a bipolar punch-through semiconductor device.

BACKGROUND INFORMATION

In EP 1 017 093 A1, a method for manufacturing an IGBT having an emitter side 14 and a collector side 16 is described. On the collector side 16 of a wafer an n doped layer is created by diffusion. On the emitter side 14, a p-base layer 4, n source regions 5 and a gate electrode 6 are then created. Afterwards an emitter electrode 82 is applied. The thickness of the wafer is reduced on the collector side 16 so that a tail section of the n doped layer remains as a buffer layer 3. Finally a p collector layer 75 and a collector electrode 92 are applied. By such a method an IGBT is created which has a lowly doped buffer layer 3. Such devices are, therefore, called soft punch-through devices. However, as the n layer from which the buffer layer is made, has to be cut within the rising doping profile as shown by the dashed line in FIG. 2, it is difficult to cut the wafer accurately. A cut at a wrong depth can lead to a device, in which the punch-through properties of the IGBT cannot be guaranteed any more, if the doping concentration is too low, or the buffer layer can be made thicker than electrically necessary to assure the punch-through properties. However, a thicker buffer layer creates higher losses and variations in bipolar gain. Furthermore, the device has non-uniform current.

Such a known method can be used for devices with blocking voltages up to around 2000 V, because such devices are relatively thin. It would be difficult if such devices were manufactured directly on a thin wafer, because working directly on thin wafers can be a rather complex process, if the wafer is thin in low voltage IGBTs for forming the frontside layers including the emitter MOS cells and termination and the backside layers including the anode and buffer regions. However, even with the implementation of the described method above, such devices need optimization for improved static and dynamic performance with a number of limiting process options.

Similar challenges are met when designing fast recovery diodes based on thin wafer processing. In addition, the larger the wafer diameter, the more the difficulties encountered for thin wafer processing. Finally, the quality and availability of silicon substrate material is also an issue for thin wafer technologies utilizing for example deep diffused methods, for example, for larger wafer diameters above 200 mm.

EP 0 749 166 A1 shows a diode which is created providing a highly doped wafer, and successively epitaxially growing layers each with constant doping concentration, but in the series with decreasing doping concentration to form intermediate buffer layer. The buffer layer includes thus a first part of constant doping concentration and another part of decreasing doping concentration. A drift layer is also grown also with a plurality of layers of decreasing doping concentration. The p doped anode layer is a diffused layer. As a diode is manufactured in EP 0 749 166 A1, no sophisticated structure is needed on the cathode (emitter) side like in a design of an IGBT.

The method applied in EP 0 749 166 A1 can be complicated, time consuming and expensive due to the necessity of growing a plurality of epitaxial layers and even more complicated due to the growing the subsequent epitaxial layers with decreasing doping concentration and ending in a device with a thick buffer layer due to a thick highly doped wafer being used as a basis for the manufacturing.

SUMMARY

A method is disclosed for manufacturing a bipolar punch-through semiconductor device having at least a two-layer structure with layers of a first and a second conductivity type, which second conductivity type is different from the first conductivity type, the method comprising: providing a wafer, which has a first side and a second side and a wafer thickness, wherein on the first side a high-doped layer of the first conductivity type is arranged, which has a constant high doping concentration; creating a low-doped layer of the first conductivity type by epitaxial growth on the first side; performing a diffusion step, by which a diffused inter-space region is created, which comprises parts of the high-doped layer and the low-doped layer, which parts are arranged adjacent to each other, which inter-space region has a doping concentration, which is higher than the doping concentration of the low-doped layer and lower than the doping concentration of the high-doped layer, wherein the remaining part of the low-doped layer forms a drift layer; creating at least one layer of the second conductivity type on the first side; and reducing the wafer thickness on the second side within the high-doped layer, so that a buffer layer is created, which includes the inter-space region and the remaining part of the high-doped layer, which forms a high-doped region, wherein the doping profile of the buffer layer decreases steadily from the doping concentration of the high-doped region to the doping concentration of the drift layer.

A bipolar punch-through semiconductor device is disclosed in form of an insulated gate bipolar transistor having a four-layer structure with layers of a first and a second conductivity type, which second conductivity type is different from the first conductivity type, between a first main side and a second main side, the semiconductor device comprising: a drift layer of the first conductivity type, which is constantly low-doped with a doping concentration of about $3*10^{13}$ cm$^{-3}$ to $2*10^{14}$ cm$^{-3}$; a buffer layer of the first conductivity type, which is arranged on the drift layer towards the second main side and which has a higher doping concentration than the drift layer, wherein the buffer layer has a thickness of about 20 to 40 μm, wherein the buffer layer comprises towards the second main side a high-doped region, which is constantly high-doped with a doping concentration of about $5*10^{14}$ to $5*10^{16}$ cm$^{-3}$, and between the high-doped region and the drift layer an inter-space region, which is a diffused region and which has a doping concentration, which decreases steadily from the doping concentration of the high-doped region to the low doping concentration of the drift layer, wherein the inter-space region region has a thickness of about 10 to 30 µm; and a layer of the second conductivity type in form of a base layer on the first main side.

DETAILED DESCRIPTION OF THE DRAWINGS

The disclosure is explained below with reference to the exemplary embodiments shown in the drawings. In the drawings.

DETAILED DESCRIPTION

Figure 1:
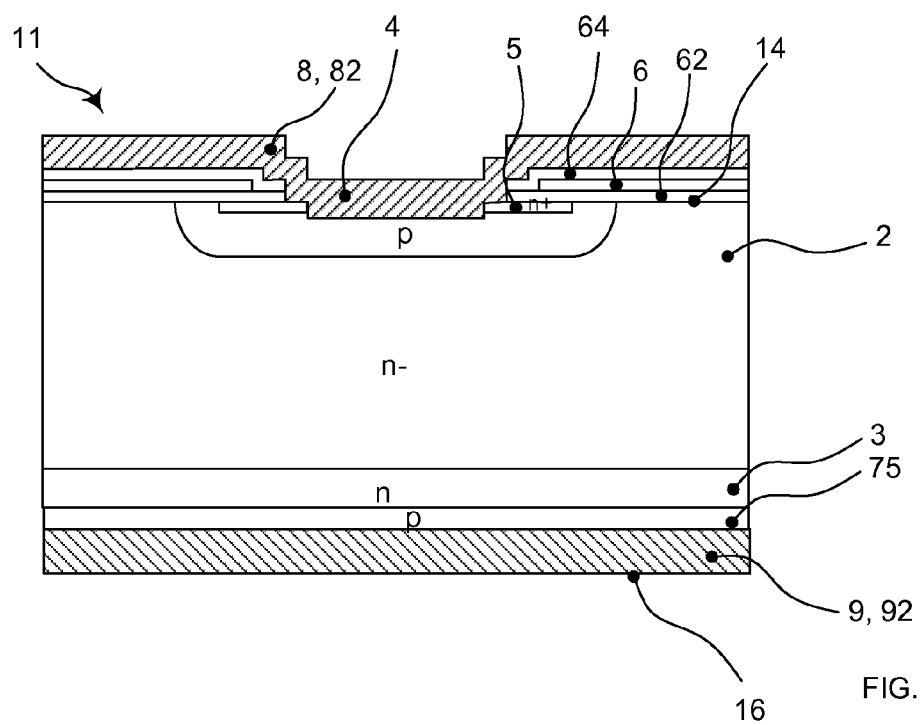
FIG. 1 shows a cross sectional view of a known IGBT with planar gate electrode.
Figure 2:
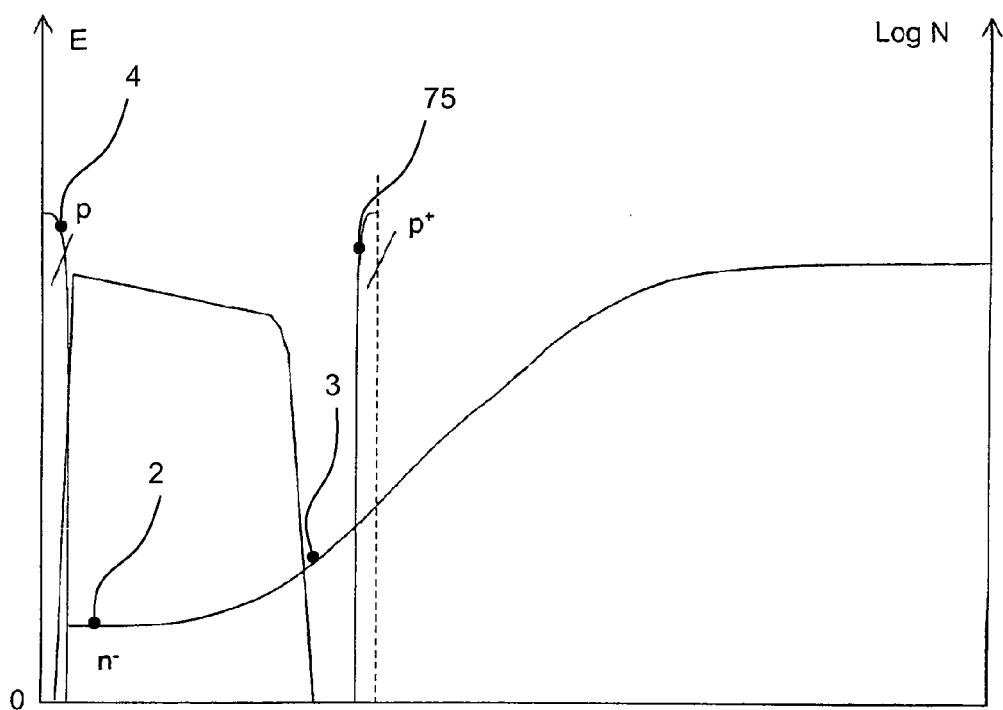
FIG. 2 shows a doping profile of the known IGBT according to FIG. 1.

In accordance with an exemplary embodiment, a method is disclosed for manufacturing a bipolar punch-through semiconductor device, which is applicable for low-voltage devices and by which method a better controllability of the manufacturing method itself and consequently of the electrical properties of the device are achievable.

In accordance with an exemplary embodiment, a method for manufacturing a bipolar punch-through semiconductor device with a semiconductor wafer is disclosed, which can include, depending on the semiconductor type, at least a two-layer structure with layers of a first and a second conductivity type, which second conductivity type is different from the first conductivity type, wherein one of the layers is a drift layer of the first conductivity type.

In accordance with an exemplary embodiment, a method is disclosed, which can include the following manufacturing steps:

(a) providing a wafer with a wafer thickness, which has a first side and a second side, wherein on the first side a high-doped layer of the first conductivity type is arranged, which has a constant high doping concentration;

(b) creating a low-doped layer of the first conductivity type by epitaxial growth on the first side;

(c) afterwards, performing a diffusion step, by which a diffused inter-space (interface) region is created, which can include parts of the original high-doped layer and the low-doped layer. These parts can be arranged adjacent to each other. The inter-space region has a doping concentration, which can be higher than the doping concentration of the low-doped layer and lower than the doping concentration of the high-doped layer, wherein the remaining part of the low-doped layer forms a drift layer;

(d) afterwards, creating at least one layer of the second conductivity type on the first side; and (e) afterwards, reducing the wafer thickness on the second side within the high-doped layer so that a buffer layer is created, which includes the inter-space region and the remaining part of the high-doped layer, which forms a high-doped region.

In accordance with an exemplary embodiment, the doping profile of the buffer layer can decrease steadily from the uniform (for example, constant) doping concentration of the high-doped region to the uniform (for example, constant) doping concentration of the drift layer.

In accordance with an exemplary embodiment, a buffer design is disclosed, which provides a final thickness similar to the known soft punch-through designs while eliminating many process issues related to known buffer formation processes. For example, improved control of the final thickness of depth, in which the high-doped layer is thinned in order to create the buffer layer can be achieved, because the thinning is done in a non-profiled part of the high-doped layer, for example, in a part of constant doping concentration. That means that no grinding or etching is performed within a rising doping concentration gradient, which could otherwise lead to variations in the bipolar gain and non-uniform current flow under different conditions.

Furthermore, the drift layer can be of high quality due to the epitaxial process while the buffer layer can utilize less stringent specifications with a lower cost impact if a homogeneously doped wafer is used as a starting material.

The process and design can be easily adapted to larger wafer diameter processing. In known methods, deep diffused buffer layers can be difficult to create for larger wafers, because buffer formation during the process includes thin wafer handling at very early stages, hence the need for wafer carrier process solutions. According to this disclosure, better handling is possible since the process includes only thin wafer handling at the backend stage compared to other buffer designs and processes and even controllable processes even for large wafers.

In accordance with exemplary embodiments, devices as disclosed can provide in terms of device performance improved design control and processes with lower leakage currents, improved short circuit capability and softer turn-off behavior.

The reference symbols used in the figures and their meaning are summarized in the list of reference symbols. Generally, alike or alike-functioning parts are given the same reference symbols. The described embodiments are meant as examples and shall not confine the disclosure.

Figure 3:
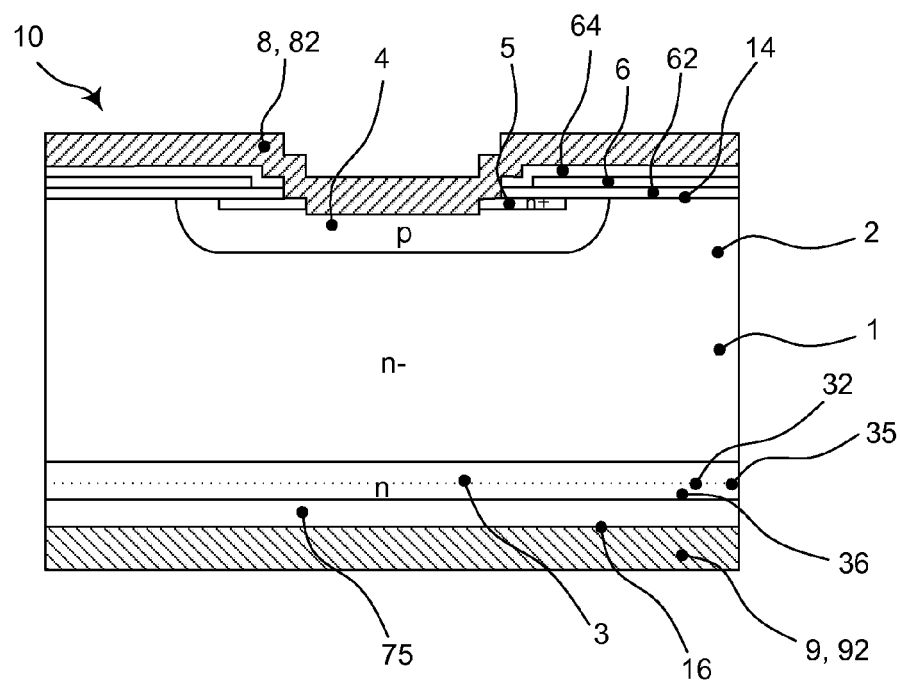
FIG. 3 shows a cross sectional view on an exemplary IGBT with planar gate electrode.
Figure 11:
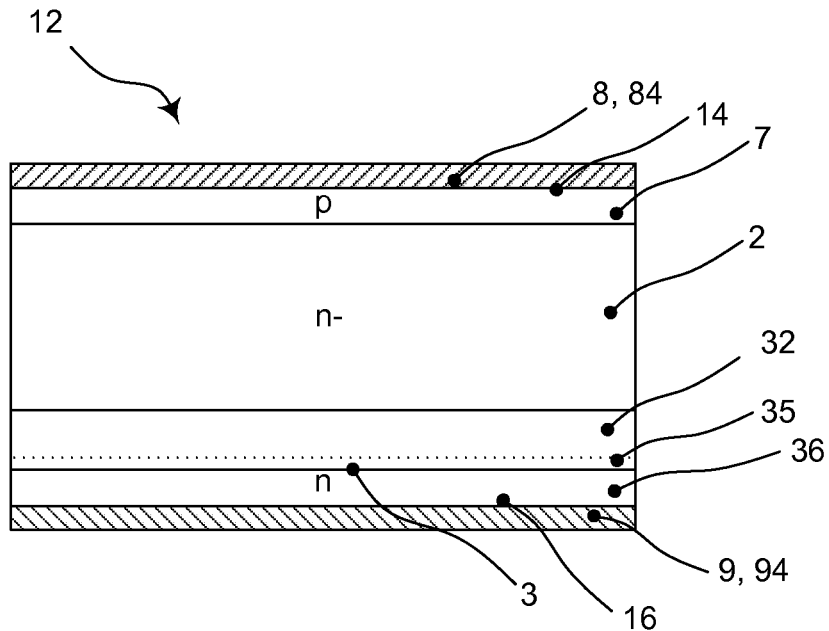
FIG. 11 shows a cross sectional view on an exemplary diode.
Figure 12:
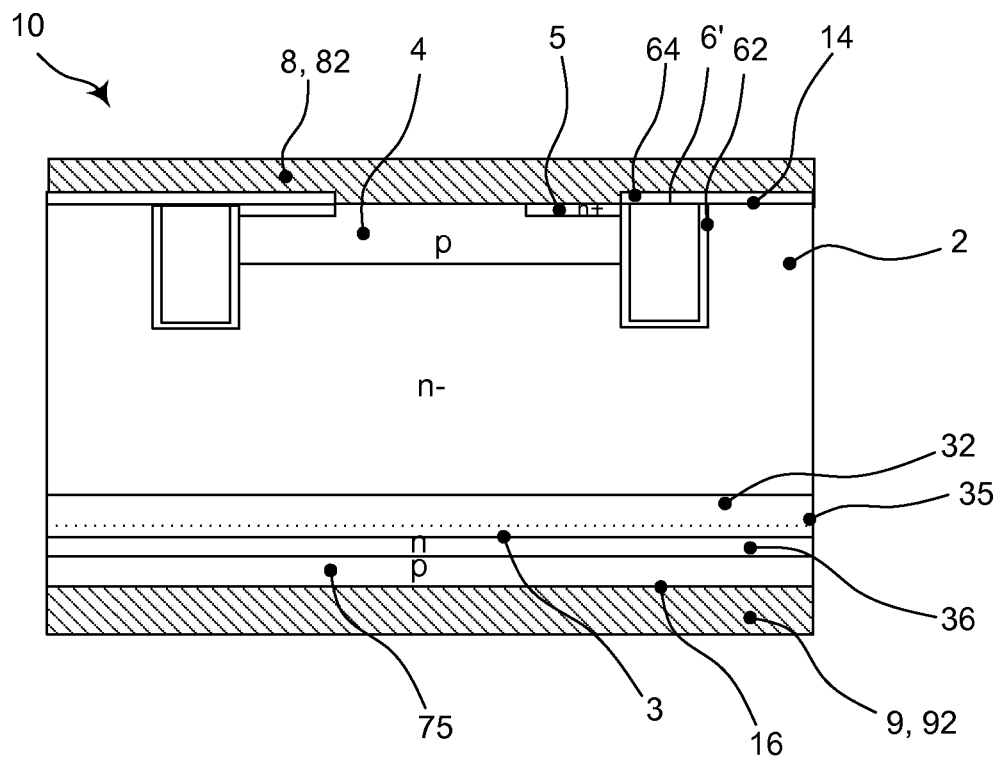
FIG. 12 shows a cross sectional view on an exemplary trench IGBT.

An exemplary bipolar punch-through semiconductor device according to the disclosure as shown in the FIGS. 3, 11 and 12 can include a semiconductor wafer 1, also called semiconductor substrate, with a first main side 14 and a second main side 16, which can be arranged opposite of the first main side 14. A first electrical contact 8 can be arranged on the first main side 14, and a second electrical contact 9 can be arranged on the second main side 16. The device can have at least a two-layer structure with layers of a first and a second conductivity type, which second conductivity type is different from the first conductivity type. One of the layers can be a low-doped drift layer 2 of a first conductivity type, for example of n type.

An exemplary device as shown in FIG. 3 is an insulated gate bipolar transistor (IGBT) 10, in which the first electrical contact can be formed as an emitter electrode 82 and the second electrical contact 9 can be formed as a collector electrode 92.

A non-punch through power semiconductor device can be a device in which the drift layer of the first conductivity type can be in contact to the collector layer without having a highly doped layer of the first conductivity type (called buffer layer) in between. The electric field in blocking condition for a non-punch-through device can be triangular and stops within the drift layer. The space charge region does not reach the collector layer.

A device including such a buffer layer (which buffer layer has higher doping concentration than the drift layer) is called a punch-through device. At higher blocking voltages the electric field at the border between the drift and buffer layer will not have reached zero. Along a short distance in the buffer layer it is then steeply decreased to zero due to the high doping concentration.

A p type layer in form of a base layer 4 can be arranged on the first main side 14 (emitter side). At least one n type source region 5 can be arranged on the emitter side 14 and can be surrounded by the base layer 4. The at least one source region 5 can have a higher doping than the drift layer 2. A first electrically insulating layer 62 can be arranged on the emitter side 14 on top of the drift layer 2, the base layer 4 and the source region 5. It at least partially covers the source region 5, the base layer 4 and the drift layer 2. An electrically conductive gate electrode 6 can be arranged on the emitter side 14 electrically insulated from the at least one base layer 4, the source regions 5 and the drift layer 2 by the electrically insulating layer 62, which can be made of, for example, silicon dioxide. In accordance with an exemplary embodiment, the gate electrode 6 can be embedded in the electrically insulating layer 62 and covered by another second insulating layer 64, for example, of the same material as the first insulating layer 62.

The choice of the doping concentration and thicknesses of the drift layer 2 can depend on the blocking capability specifications. In accordance with an exemplary embodiment, the low-doped drift layer 2 can be the main region for supporting the blocking voltage on the main PN junction side (emitter for IGBT, anode for diode) while the higher doped buffer layer can be near the second main side (collector side for IGBT or cathode side in case of a diode). For example, thicknesses of a drift layer for a 600 V device can be 30 to 70 μm, 80 to 120 μm for a 1200 V device and 150 to 190 μm for a 1700 V device. In accordance with an exemplary embodiment, the doping concentration for a lower voltage device can be higher than for a higher voltage device, for example, around $1.5*10^{14}$ cm$^{-3}$ for a 600 V device down to $5*10^{13}$ cm$^{-3}$ for a 1700 V device. However, the concrete values for a device may vary depending on its application.

For an IGBT with a gate electrode formed as a planar gate electrode 9 as shown in FIG. 3 the first electrically insulating region 62 can be arranged on top of the emitter side. In between the first and second electrically insulating layers 62, 64, the gate electrode 6 can be embedded, for example, the gate electrode 6 can be completely embedded. The gate electrode 6 can be made of a heavily doped polysilicon or a metal like aluminum.

In accordance with an exemplary embodiment, the at least one source region 5, the gate electrode 6 and the electrically insulating layers 62, 64 can be formed in such a way that an opening is created above the base layer 4. The opening can be surrounded by the at least one source region 5, the gate electrode 6 and the electrically insulating layers 62, 64.

The first electrical contact 8 can be arranged on the first main side 14 covering the opening so that it is in direct electrical contact to the base layer 4 and the source regions 5. This first electrical contact 8 can also cover the electrically insulating layers 62, 64, but can be separated and thus electrically insulated from the gate electrode 6 by the second electrically insulating layer 64.

An exemplary IGBT with a planar gate electrode 6 is disclosed, the IGBT can include a gate electrode formed as trench gate electrode 6' as shown in FIG. 12. The trench gate electrode 6' can be arranged in the same plane as the base layer 4 and adjacent to the source regions 5, separated from each other by a first insulating layer 62, which also separates the gate electrode 6 from the drift layer 2. A second insulating layer 64 can be arranged on top of the gate electrode formed as a trench gate electrode 9', thus insulating the trench gate electrode 6' from the first electrical contact 8 (FIG. 12).

A buffer layer 3, which has a higher doping concentration than the drift layer 2, can be arranged on the drift layer 2 towards the second main side 16. The buffer layer 3 can include towards the second main side 16 a high-doped region 36, which can be constantly high-doped, and between the high-doped region 36 and the drift layer 2 an inter-space region 32, which can be a diffused region, which means that it has a doping concentration, which decreases steadily from the doping concentration of the uniformly high-doped region to the uniform low doping concentration of the drift layer. The high-doped region 36 can be a region with higher doping concentration than the low-doped drift layer 2.

In the diffused inter-space region 32 the doping concentration can decrease by a Gaussian function. However, if by diffusion another continuously decreasing profile of the doping concentration can be achieved, this shall be also covered by the disclosure.

A collector layer 75 can be arranged on the second main side 16 between the buffer layer 3 and the collector electrode 92.

The exemplary bipolar punch-through semiconductor devices can also be reverse conducting IGBTs with alternating p doped collector layer 75 and n+ doped additional layers in a plane parallel to the second main side 16.

In FIG. 11, an exemplary bipolar punch-through semiconductor device in form of a bipolar diode 12 is shown. The diode 12 can include a drift layer 2 of a first conductivity type, for example, of n type, with a first main side 14 and a second main side 16 opposite the first main side 14. A p doped layer in form of an anode layer 7 can be arranged on the first main side 14. A first electrical contact 8 as an anode electrode 84, in form of a metal layer can be arranged on top of the anode layer 7, for example, on that side of the layer 7, which lies opposite the drift layer 2.

In accordance with an exemplary embodiment, towards the second main side 16, an exemplary (n) doped buffer layer 3 can be arranged. This buffer layer 3 can have a higher doping concentration than the drift layer 2. A second electrical contact 9 as a cathode electrode 94, for example, in form of a metal layer, can be arranged on top of buffer layer 3, for example, on that side of the buffer layer 3, which lies opposite the drift layer 2. Again, the buffer layer 3 can include a constantly high-doped layer 36, which can be arranged towards the anode electrode 94 and an inter-space region 32, which can be arranged between the high-doped region 36 and the drift layer 2. The inter-space region 32 can be designed as disclosed above for the exemplary IGBT 10.

In accordance with an exemplary embodiment, an exemplary bipolar punch-through semiconductor device can, for example, be used in a converter.

Figure 5:
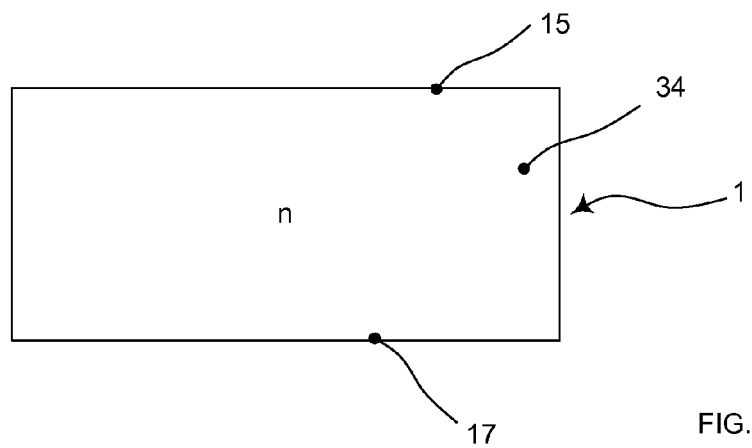
FIGS. 5 to 9 show manufacturing steps for manufacturing an exemplary semiconductor device.
Figure 6:
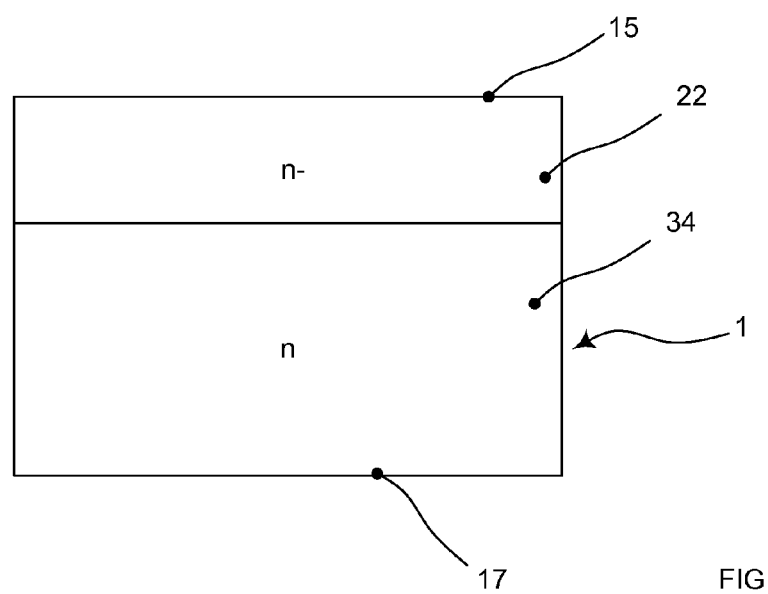
Figure 8:
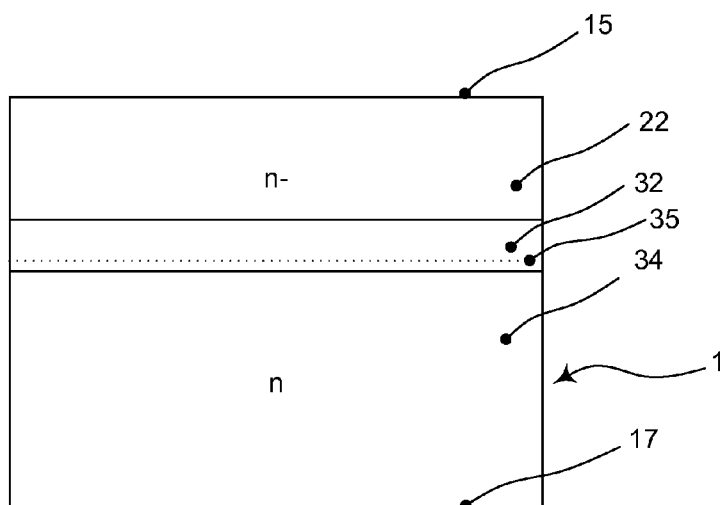
Figure 9:
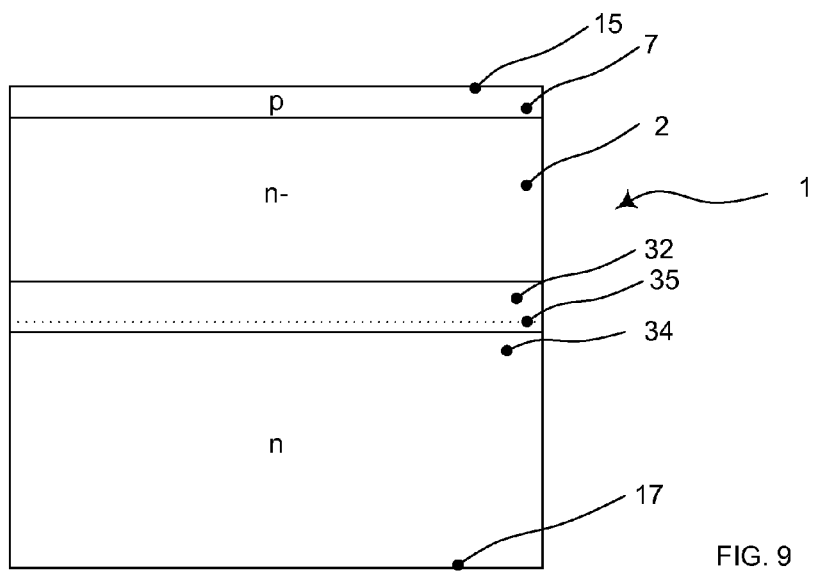
Figure 10:
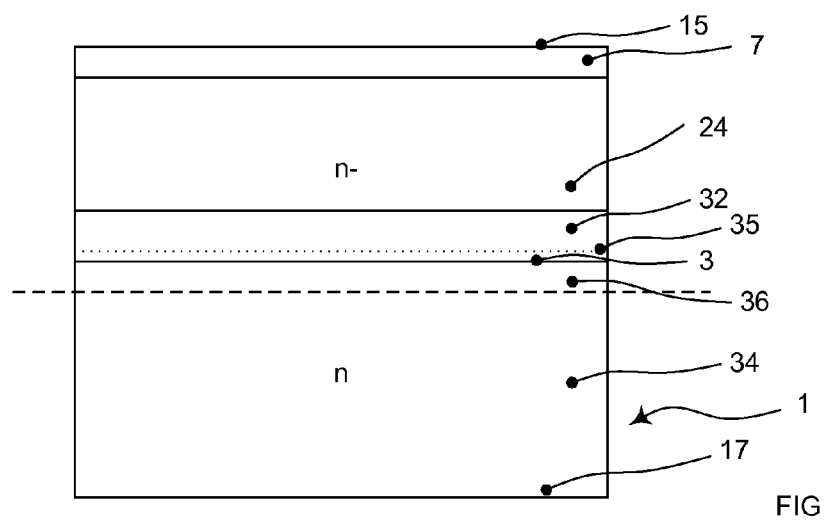
FIG. 10 shows a manufacturing step for manufacturing an exemplary diode.

In accordance with an exemplary embodiment, for manufacturing an exemplary bipolar punch-through semiconductor device the following steps can be performed:

(a) providing a wafer with a wafer thickness, which has a first side 15 and a second side 17, wherein on the first side 15 a high-doped n type layer 34 is arranged, which has a constant high doping concentration (FIG. 5). For example, the high-doped layer 34 has a doping concentration of about (e.g., ±10%)$5*10^{14}$ to $5*10^{16}$ cm$^{-3}$;

(b) creating a low-doped n type layer 22 by epitaxial growth on the first side 15 (FIG. 6) on top of the high-doped layer 34. By epitaxial growth, a layer is achieved with constant doping concentration. For example, that means that the layer shows a uniform doping concentration. The low-doped layer 22, can, for example, be created with a doping concentration of about (e.g., ±10%) $3*10^{13}$ cm$^{-3}$ to $2*10^{14}$ cm$^{-3}$;

(c) afterwards, performing a diffusion step, by which a diffused inter-space region 32 is created, which includes parts of the high-doped layer 34 and the low-doped layer 22, which parts are arranged adjacent to each other (FIG. 8). The inter-space region 32 has a doping concentration, which can be higher than the doping concentration of the low-doped layer and lower than the doping concentration of the high-doped layer, wherein the remaining part of the low-doped layer forms a drift layer 2. In FIG. 8 the original border 35 between the high-doped and low-doped layer 34, 22 is shown as a dotted line;

(d) afterwards, creating at least one layer of the second conductivity type on the first side 15 on top of the drift layer 2 (FIG. 9, which shows the manufacturing method for a diode). For example, the p doped layer can also be diffused into the drift layer 2 such that the p doped layer is arranged on the first main side 15 with the drift layer 2 below the p doped layer;

(e) afterwards, reducing the thickness of the wafer on the second side 17 within the high-doped layer 34 so that a buffer layer 3 is created, which can include the inter-space region 32 and at least a remaining part of the high-doped layer, which forms a high-doped region 36 (FIG. 10, in which the method is exemplarily shown for the creation of a diode). Any appropriate method well-known to the experts can be used for the reduction of the thickness like grinding or etching. For example, the thickness can be reduced by removing a part of the wafer over the whole plane of the wafer on the second side and parallel to the second side. The doping profile of the buffer layer decreases steadily from the doping concentration of the high-doped region to the doping concentration of the drift layer.

Figure 7:
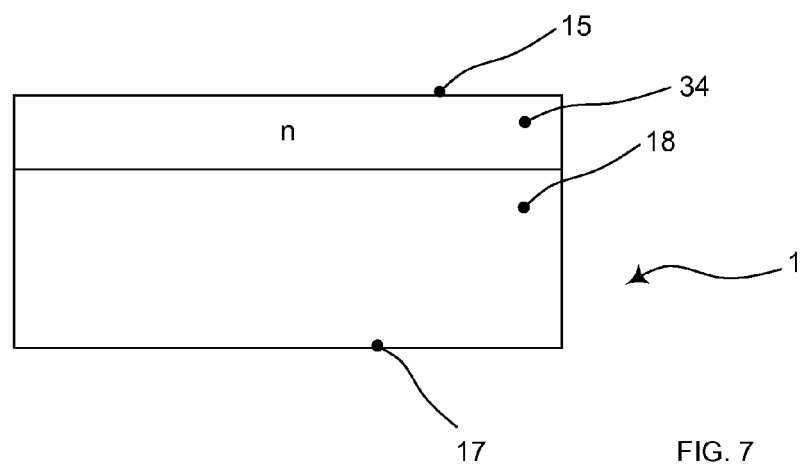

The wafer, which is provided for step (a) can be a complete n type wafer, which can be constantly high-doped. The wafer thickness can be the thickness of the wafer between the first and second side 15, 17 in step (a). Alternatively, the whole wafer 1 may include on the second side 17 a mounting layer 18, which can be completely removed in step (e) and a high doped layer 34 on the first side 15 (shown in FIG. 7). The mounting layer 18 can be a low cost material, for example, of n type or p type. For example, in accordance with an exemplary embodiment, the mounting layer 18 can be a p-type high-doped layer. As it is completely removed, there are no high specifications to the mounting layer 18 besides that it must be possible to create a high-doped layer 34 and low doped layer 22 on the mounting layer. In accordance with an exemplary embodiment, the high-doped layer 34 can be created by epitaxial growth, because the high-doped layer 34 (as well as the low doped layer 22) is of constant doping concentration. The further manufacturing steps can be the same as disclosed above for the uniform n-type wafer.

In accordance with an exemplary embodiment, the diffusion can be performed at a temperature of at least 1200° C. and during a time period of at least 180 min. In step (c) by the diffusion particles from the high-doped layer 34 diffuse into the low-doped layer 22 so that an inter-space region 32 is created, which includes such part from the high-doped layer 34, from which particles have been diffused and such part of the low-doped layer 22, into which the particles from the high-doped layer 34 have been diffused to. The drift layer 2 is such part of the low-doped layer 22 with unamended low doping concentration, whereas the buffer layer 3 includes such regions towards the second side 17, which are n type and which have higher doping concentration than the drift layer 2. That is the inter-space region 32 and such part of the high-doped layer 34, which after thinning and diffusion remains with the high doping concentration. This part forms the high-doped region 36.

Figure 4:
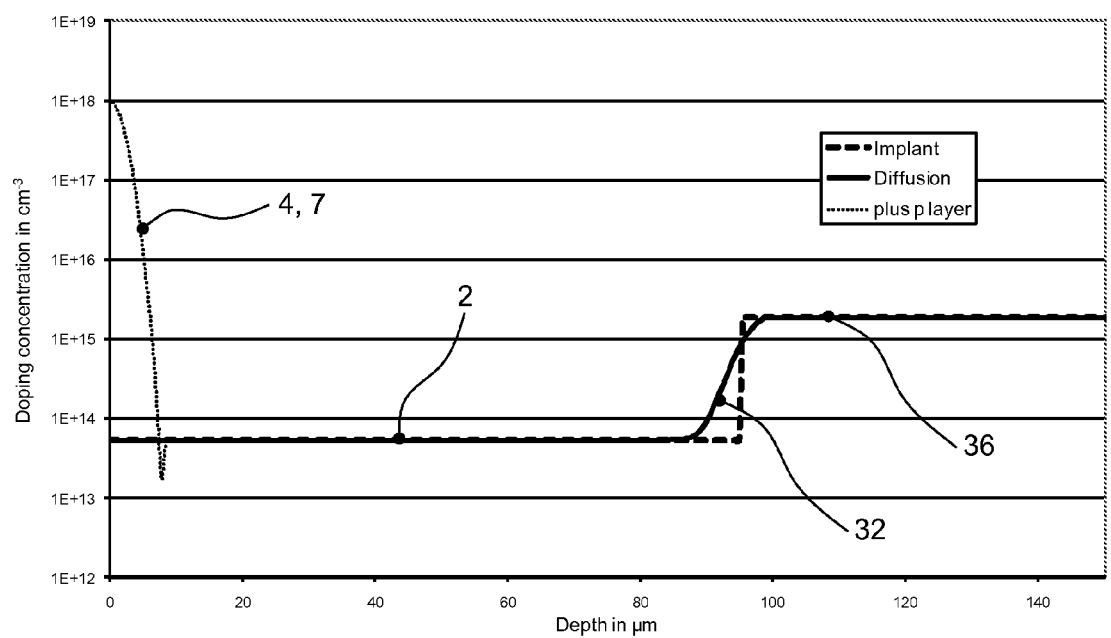
FIG. 4 shows a doping profile of the exemplary IGBT according to FIG. 3.

FIG. 4 shows the doping concentration within the wafer for a uniform n type wafer in different manufacturing steps, wherein the dashed line shows the doping concentration of the high-doped layer 34 and low doped layer 22 after implantation (step (b)). The continuous line shows the wafer after diffusion (step (c)) and the dotted line shows the wafer after the p type layer can be created on the first main side (step (d)).

In step (d), in case of a diode 12, an anode layer 7 can be created. The first electrical contact 8 formed as an anode electrode 84 may be created at this step, for example, by deposition of metal on the first and second side 15, 17. Alternatively, the anode electrode 84 may be created together with the cathode electrode 94 after the thinning of step (e).

In step (d), in case of an IGBT 10, the p base layer 4 and the source region 5 are created on the first side 15, afterwards the planar gate electrode 6 or trench gate electrode 6' is created on the first side together with its insulation layers 62, 64. The first electrical contact 8 formed as emitter electrode 82 may be made on the first side 15 at this step (d). Alternatively, the emitter electrode 82 may be created together with the collector electrode 92 after the thinning of step (e). The p collector layer 75 is created and on the second side 17 after the thinning of step (e), but before the creation of the collector electrode 92. In case of a reverse conducting IGBTs a doped collector layer alternating with an n+ doped additional layer is created in a plane parallel to the second side 17 after thinning (step (e)) by using masking techniques well-known to experts.

For example, in accordance with an exemplary embodiment, a thickness of the buffer layer 3 can be about 20 to 40 μm. The buffer layer 3 can include towards the second main side 16 a high-doped region 36, for example, a section, which has constant doping concentration. The inter-space region 32 between the high-doped region 36 and the drift layer 2 can be thinner than the buffer layer 3 due to the presence of the high-doped region 36. For example, the inter-space region 32 can have a thickness of about 10 to 30 μm.

After the buffer layer 3 has been created other layers may be created in or on the wafer 1 on the second side 17 and after thinning. For creating an IGBT, for example the p doped collector layer 75 and the collector electrode 92 are now created. For example, it shall not be excluded from the disclosure to create layers on the first side 15 after thinning.

These examples shall not limit the scope of the disclosure. The above mentioned designs and arrangements are just examples for any kinds of possible designs and arrangements for the base layer(s) and well (zones).

In another embodiment, the conductivity types are switched, e.g., all layers of the first conductivity type are p type (for example, the drift layer 2, the source region 5) and all layers of the second conductivity type can be n type (for example, base layer 4, the collector layer 75).

It should be noted that the terms "comprising" and including do not exclude other elements or steps and that the indefinite article "a" or "an" does not exclude the plural. Also elements described in association with different embodiments may be combined. It should also be noted that reference signs in the claims shall not be construed as limiting the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST

1 Wafer
10 IGBT
12 Diode
14 first main side
15 first side
16 second side
17 second main side
18 mounting layer
2 drift layer
21 thickness of drift layer
22 low-doped layer
24 low-doped region
25 thickness of low-doped region
3 buffer layer
31 thickness of buffer layer
32 Inter-space region
33 thickness of inter-space region
34 high-doped layer
35 original border between low-doped and high-doped layer
36 high-doped region
37 thickness of high-doped region
4 base layer
5 source region
6 gate electrode
62 first insulating layer
64 second insulating layer
7 anode layer
75 collector layer
8 first electrical contact
82 emitter electrode
84 cathode electrode
9 second electrical contact
92 collector electrode
94 anode electrode

What is claimed is:

1. A method for manufacturing a bipolar punch-through semiconductor device having at least a two-layer structure with layers of a first and a second conductivity type, which second conductivity type is different from the first conductivity type, the method comprising:
    providing a wafer which comprises a first side and a second side, a wafer thickness and a high-doped layer of the first conductivity type at the first side, wherein the high-doped layer has a constant high doping concentration;
    forming a low-doped layer of the first conductivity type on top of the high-doped layer by epitaxial growth on the first side;
    performing a diffusion step, to form a diffused inter-space region, which comprises a portion of the high-doped layer and a portion of the low-doped layer, wherein the portions are arranged adjacent to each other, wherein the diffused inter-space region has a doping concentration higher than the doping concentration of the low-doped layer and lower than the doping concentration of the high-doped layer, wherein the remaining part of the low-doped layer forms a drift layer;
    forming at least one layer of the second conductivity type on top of the drift layer on the first side; and
    reducing the wafer thickness on the second side within the high-doped layer to form a buffer layer comprising both the inter-space region and the remaining portion of the high-doped layer, wherein the remaining portion of the high-doped layer forms a high-doped region, wherein the doping profile of the buffer layer decreases steadily from the doping concentration of the high-doped region to the doping concentration of the drift layer.

2. The method according to claim 1, wherein the wafer is completely made of the first conductivity type and constantly doped with a high doping concentration from $5 \times 10^{14}$ to $5 \times 10^{16}$ cm$^{-3}$.

3. The method according to claim 1, comprising:
    removing a mounting layer from the second side of the wafer during the step of reducing the wafer thickness on the second side.

4. The method according to claim 1, comprising:
    reducing the thickness of the wafer such that the buffer layer has a thickness of about 20 μm to 40 μm.

5. The method according to claim 1, comprising:
    forming the inter-space region such that the inter-space region has a thickness of about 10 μm to 30 μm.

6. The method according to claim 1, wherein the high-doped layer has a doping concentration of about $5 \times 10^{14}$ to $5 \times 10^{16}$ cm$^{-3}$.

7. The method according to claim 1, comprising:
    performing the diffusion step at a temperature of at least 1200° C.

8. The method according to claim 1, comprising:
    performing the diffusion step during a time period of at least 180 min.

9. The method according to claim 1, comprising:
    forming the low-doped layer with a doping concentration of about $3 \times 10^{13}$ cm$^{-3}$ to $2 \times 10^{14}$ cm$^{-3}$.

10. The method according to claim 1, comprising:
    performing the diffusion step after the step of forming the low-doped layer of the first conductivity type.

11. The method according to claim 10, comprising:
    performing the step of forming the at least one layer of the second conductivity type on the first side after the diffusion step.

12. The method according to claim 11, comprising:
    performing the step of reducing the wafer thickness on the second side after the step of forming the at least one layer of the second conductivity type on the first side.

13. The method according to claim 1, wherein the device is an insulated gate bipolar transistor.

14. The method according to claim 1, wherein the device is a diode.

15. A bipolar punch-through semiconductor device in form of an insulated gate bipolar transistor having a four-layer structure with layers of a first and a second conductivity type, which second conductivity type is different from the first conductivity type, between a first main side and a second main side, the semiconductor device comprising:
    a drift layer of the first conductivity type, which is constantly low-doped with a doping concentration of about $3 \times 10^{13}$ cm$^{-3}$ to $2 \times 10^{14}$ cm$^{-3}$;
    a buffer layer of the first conductivity type, which is arranged on the drift layer towards the second main side and which has a higher doping concentration than the drift layer, wherein the buffer layer has a thickness of about 20 μm to 40 μm, wherein the buffer layer comprises towards the second main side a high-doped region, which is constantly high-doped with a doping concentration of about $5 \times 10^{14}$ to $5 \times 10^{16}$ cm$^{-3}$ and between the high-doped region and the drift layer an inter-space region, which is a diffused region and which has a doping concentration, which decreases steadily from the doping concentration of the high-doped region to the low doping concentration of the drift layer, wherein the inter-space region has a thickness of about 10 μm to 30 μm; and a layer of the second conductivity type in form of a base layer on the first main side.

16. The semiconductor device according to claim 15, wherein the doping concentration of the inter-space region decreases by a Gaussian function.

17. The semiconductor device according to claim 15, wherein the drift layer has a doping concentration of doping concentration of about $3 \times 10^{13}$ to $2 \times 10^{14}$ cm$^{-3}$.

* * * * *